United States Patent
Suchalkin et al.

(10) Patent No.: US 9,627,422 B2
(45) Date of Patent: Apr. 18, 2017

(54) PHOTODETECTOR

(71) Applicant: BAH Holdings LLC, Glen Cove, NY (US)

(72) Inventors: Sergey Suchalkin, Stony Brook, NY (US); Michael Tkachuk, South Setauket, NY (US)

(73) Assignee: BAH HOLDINGS LLC, Glen Cove, NY (US)

( * ) Notice: Subject to any disclaimer, the term of this patent is extended or adjusted under 35 U.S.C. 154(b) by 0 days.

(21) Appl. No.: 14/714,079

(22) Filed: May 15, 2015

(65) Prior Publication Data

US 2016/0336361 A1 Nov. 17, 2016

(51) Int. Cl.
*H01L 27/14* (2006.01)
*H01L 27/144* (2006.01)
*H01L 27/146* (2006.01)

(52) U.S. Cl.
CPC .... *H01L 27/1443* (2013.01); *H01L 27/14665* (2013.01)

(58) Field of Classification Search
CPC . H01L 31/032; H01L 31/0264; H01L 31/101; H01L 31/167
USPC .......................................... 257/72
See application file for complete search history.

(56) References Cited

U.S. PATENT DOCUMENTS

| | | | | |
|---|---|---|---|---|
| 4,126,150 | A * | 11/1978 | Bell | H01L 31/02168 136/255 |
| 6,803,557 | B1 * | 10/2004 | Taylor | H01L 27/14618 250/208.1 |
| 7,687,871 | B2 | 3/2010 | Maimon | |
| 7,795,640 | B2 | 9/2010 | Klipstein | |
| 8,890,272 | B2 * | 11/2014 | Tkachuk | H01L 31/105 257/233 |
| 2002/0125472 | A1 * | 9/2002 | Johnson | B82Y 20/00 257/21 |
| 2004/0067324 | A1 * | 4/2004 | Lazarev | H01L 51/0012 428/1.31 |
| 2013/0037854 | A1 * | 2/2013 | Tkachuk | H01L 31/105 257/184 |

(Continued)

*Primary Examiner* — Michael Lebentritt
(74) *Attorney, Agent, or Firm* — James P. Muraff; Neal, Gerber & Eisenberg LLP

(57) ABSTRACT

There is provided a photodetector, comprising a semiconductor heterostructure having in sequence: a first collection layer having substantially uniform doping of a first doping type; a radiation-absorbing layer having substantially uniform doping of the first doping type and having a band gap less than or equal to that of the first collection layer; and a barrier layer having a band gap greater than that of the radiation-absorbing layer, the top of the valence band of the barrier layer being substantially equal in energy to that of the radiation-absorbing layer where the first doping type is n-type or the bottom of the conduction band of the barrier layer being substantially equal in energy to that of the radiation-absorbing layer where the first doping type is p-type; wherein a first portion of the barrier layer is of the first doping type and a second portion of the barrier layer is of a second doping type, the first portion of the barrier layer being adjacent to the radiation-absorbing layer, forming a heterojunction within the barrier layer which gives rise to a depletion region within each portion of the barrier layer.

23 Claims, 4 Drawing Sheets

(56) References Cited

U.S. PATENT DOCUMENTS

2015/0041655 A1* 2/2015 Tkachuk .......... H01L 31/03046
    250/338.4

* cited by examiner

PHOTODETECTOR

The present invention relates to semiconductor photodetectors and is particularly concerned with increased sensitivity of the detector and improved temperature stability.

Photodetectors, i.e. devices which detect light or other electromagnetic energy, are widely used for a variety of applications such as imaging, security systems, gas sensing and others. A photodetector sensitive to infrared light is known as an infrared (IR) photodetector. The most advanced modern semiconductor photodetectors are designed as hetero-structures of different semiconductors. Infrared photodetectors, which work in the range 3 to 10 microns wavelength, are often based on relatively narrow band gap semiconductors such as GaAs, InSb, AlAs and their solid solutions.

A basic, conventional photovoltaic detector 1 comprises a semiconductor diode having two layers of semiconductor material 2, 3 with different types of conductivity, as shown in FIG. 1. The conductivity type of each layer is controlled by introducing different types of dopant into the semiconductor material: either "donors" or "acceptors". Introduction of donors leads to an excess of mobile electrons and the conductivity type (or "doping type") is negative: "n-type" (layer 2). Doping with acceptors on the other hand leads to a majority of mobile holes and hence a positive conductivity type: "p-type" (layer 3). In the region near the boundary between the n- and p-type materials, the electrons recombine with the holes and a depletion region 4 is formed, as shown in FIG. 2.

The depletion region is characterised by a built-in electric field and the concentration of mobile carriers in the depletion region 4 is reduced compared with the non-depleted regions. When the external bias on the p-n junction is zero, the diffusion currents of the carriers are compensated by the drift currents produced by the built-in electric field so that the net current in the device is zero. When radiation of a suitable wavelength is absorbed by the structure, electron-hole pairs will be generated and the carriers will diffuse with the electrons flowing towards the n-type layer 2 and the holes towards the p-type layer 3 and separated by the electric field (and accelerated across the depletion region 4), resulting in a current which can be measured by connection to an external circuit C. Note throughout the Figures, the dashed line $E_F$ represents the Fermi level.

Among the major disadvantages of the simple photodiode shown in FIGS. 1 and 2 is increased generation-recombination noise due to thermal generation of electron-hole pairs in the depletion region 4. This process involves deep energy levels or parasitic states in the middle of the band gap and is characterized by a strong temperature dependence since the activation energy is half of the band gap. The magnitude of the generation-recombination noise is also proportional to the width of the depletion region 4.

Recently, it has been proposed to utilise a barrier region with a wide band gap in the semiconductor structure to suppress generation-recombination noise and reduce or eliminate such thermal current. Parasitic mid-gap states in a wide gap barrier have high thermal activation energy, so the temperature dependence of the GR noise is less steep. For example, an nBn (n-type-Barrier-n-type) detector 10 is shown in FIG. 3. The structure comprises four layers: a first n-type collection layer ("n-contact") 11 with a high doping level, an radiation-absorbing region 12 with a low n-doping level, a wide band gap barrier layer 13 and a second heavily doped n-contact 14. The materials are chosen in such a way that the top of the valence band of all the layers have substantially the same energy. An example of an nBn detector of this sort is disclosed in U.S. Pat. No. 7,687,871.

The operation of a nBn detector requires the application of an external bias voltage V. The positive side ("plus") of the bias is applied to the first n-contact 11, and the negative ("minus") to the second one 14. The band diagram of the biased nBn detector is presented in FIG. 4. The electrons and holes excited by the detected radiation received by the absorbing layer 12 are separated at the absorber boundaries. Direct transport of the majority carriers (here, electrons) to the second n-contact 14 is blocked by the barrier 13 and the transport of photo-exited holes into the first n-contact 11 is blocked by the built-in electric field at the boundary between layers 11 and 12. Since there is no electric field in the absorber 12, the thickness of this layer can be increased without corresponding increase in the generation-recombination noise.

While nBn detectors must be operated under bias, nBp (n-type-Barrier-p-type) detectors are able to work in the photovoltaic regime, i.e. the photocurrent is generated without external bias. A band diagram of a nBp detector 20 is presented in FIG. 5, and an example of such a device is also disclosed in U.S. Pat. No. 7,687,871. The device structure comprises four layers: a first n-type collection layer ("n-contact") 21 with a high doping level, an absorber 22 with a low n-doping level, a wide band gap barrier layer 23 and a heavily p-doped second collection layer ("p-contact") 24. The materials are chosen in such way that the top of the valence band of the absorber 22 and the barrier 23 have substantially the same energy while the top of the valence band of the p-contact 24 has an energy higher than those of the absorber 22 and the barrier 23.

The electrons and holes generated by the radiation received in the absorber 22 are separated. The holes can diffuse into the p-contact 24 since there is no barrier for holes between the absorber 22 and p-contact 24. The electrons cannot reach the p-contact 24 due to the barrier 23 but they can easily diffuse into the n-contact 21. This separation of the photo-excited carriers produces a photocurrent in an external circuit C connecting the n- and p-contacts 21, 24. As in the case of the nBn detector, the absorber thickness of the nBp device 20 can be increased without increasing the generation-recombination noise.

It will be appreciated that corresponding devices of the opposite doping types to those mentioned above also exist, i.e. pBp detectors and pBn detectors, the doping type of each layer described above being switched from n-type to p-type and vice versa.

Further examples of semiconductor photodetectors utilising barrier layers are disclosed in U.S. Pat. No. 7,795,640.

In accordance with the present invention, a photodetector is provided, comprising a semiconductor heterostructure having in sequence:

a first collection layer having substantially uniform doping of a first doping type;

a radiation-absorbing layer having substantially uniform doping of the first doping type and having a band gap less than or equal to that of the first collection layer; and a barrier layer having a band gap greater than that of the radiation-absorbing layer, the top of the valence band of the barrier layer being substantially equal in energy to that of the radiation-absorbing layer where the first doping type is n-type or the bottom of the conduction band of the barrier layer being substantially equal in energy to that of the radiation-absorbing layer where the first doping type is p-type;

wherein a first portion of the barrier layer is of the first doping type and a second portion of the barrier layer is of a second doping type, the first portion of the barrier layer being adjacent to the radiation-absorbing layer, forming a heterojunction within the barrier layer which gives rise to a depletion region within each portion of the barrier layer.

It will be appreciated that the term "doping type" refers to either "n-type" or "p-type". Hence the first doping type may be n-type and the second doping type p-type, or vice versa. The term does not concern the level of doping: hence two layers of the same doping type may have the same or different doping levels but will either both be n-type or both be p-type. Throughout this specification, unless otherwise specified, where two physical distances (such as the thickness of the first portion of the barrier layer and the width of the depletion region in the first portion of the barrier layer, both recited above) are referred to as being "substantially equal" to one another, this means that the two distances are within +/−10%, more preferably +/−5%, of each other. It will further be appreciated that in each of the embodiments of the present invention, it should be assumed that the Fermi levels are equalised throughout the structure, unless explicitly stated otherwise (for example, if an external bias is applied to the device).

By arranging the two portions of the barrier layer to be of different doping types, a depletion region is set up within the barrier layer and hence an electric field is established across it. The electric field acts to promote flow of the minority carriers (i.e. holes where the absorber is n-type; electrons where it is p-type) across the barrier without the need for the application of an external bias, and so the photodetector of the present invention is operated in the photovoltaic regime. It will be noted that no such electric field exists in conventional nBp (or pBn) detectors as described above, whilst in nBn (or pBp) detectors such a field will only be established by the application of an external bias, which is undesirable.

Although the present invention may be implemented using a thickness of the first portion of the barrier layer being greater than, lesser than or substantially equal to the width of the depletion region in said first portion, it is preferred that the thickness of the first portion of the barrier layer is substantially equal to or greater than the width of the depletion region in the first portion of the barrier layer. This avoids the electric field of the depletion region extending into the absorber layer.

However, it is particularly preferred that the thickness of the first portion of the barrier layer is substantially equal to the width of the depletion region that arises in the same portion. This has the result that substantially all of the dopants in the first portion of the barrier layer are ionised whilst the electric field does not extend substantially into the absorber layer so as not to increase the generation-recombination noise. This allows the thickness of the absorber layer to be increased, thus achieving higher signal generation in the photodetector, without a corresponding increase in noise. Meanwhile, the larger band gap of the barrier layer in the disclosed device will still act to obstruct flow of majority carriers (i.e. electrons where the absorber is n-type; holes where it is p-type) from the absorber layer across the barrier, thereby reducing or eliminating generation-recombination noise. The arrangement of the thickness of the first portion of the barrier layer being substantially equal to the width of the depletion region in the first portion of the barrier layer further provides for a particularly high zero-bias resistance of the structure, which is important for achieving a high signal-to-noise ratio. It should be understood that this preferred feature of the thickness of the first portion of the barrier layer being substantially equal to the width of the depletion region in the first portion of the barrier layer may be combined with any other preferred or optional feature that will be described below.

In some embodiments, the second portion of the barrier layer acts as a second collection layer which receives minority carriers from the absorber layer across the barrier and may be connected to an external circuit. In this case the doping level of the second portion is preferably high (e.g. higher than that of the first portion). However in other preferred embodiments, the photodetector further comprises a second collection layer adjacent to the second portion of the barrier layer, the second collection layer having substantially uniform doping of the second doping type. In this case, the band gap of the second collection layer is preferably less than that of the barrier layer. The provision of an additional collection layer in this way may be desirable in order to protect the device surface from oxidation, as may especially be the case if an alloy containing aluminium is used as the barrier layer.

Where such a second collection layer is provided, in some preferred embodiments, either:
  where the first doping type is n-type, the top of the valence band of the second collection layer is substantially equal in energy to that of the barrier layer and the radiation-absorbing layer; or
  where the first doping type is p-type, the bottom of the conduction band of the second collection layer is substantially equal in energy to that of the barrier layer and the radiation-absorbing layer.

In this context, by "substantially equal" it is meant that the two energies are within +/−10%, more preferably +/−5%, of each other. More preferably the difference between the energies is less than kT, where k is the Boltzman constant (k=1.38×10^−23 Joules/Kelvin), and T is the operation temperature. For example, at room temperature (T=300K), kT~4×10^−21J or ~26 meV).

Meanwhile in other preferred implementations, either:
  where the first doping type is n-type, the top of the valence band of the second collection layer is higher in energy than that of the barrier layer and the radiation-absorbing layer; or
  where the first doping type is p-type, the bottom of the conduction band of the second collection layer is lower in energy than that of the barrier layer and the radiation-absorbing layer.

Where such an energy difference exists, it is preferred that, either:
  where the first doping type is n-type, the energy difference between the top of the valence band of the second collection layer and the bottom of the conduction band of the radiation-absorbing layer is approximately equal in magnitude to the potential difference across the barrier layer; or
  where the first doping type is p-type, the energy difference between the bottom of the conduction band of the second collection layer and the top of the valence band of the radiation-absorbing layer is approximately equal in magnitude to the potential difference across the barrier layer.

Such configurations are preferable because the result is that the relevant energy levels of the absorber and second collection layer are approximately the same as one another once the voltage difference established by the barrier is applied. This means that only a relatively small amount of charge transfer between the two layers is required in order to align the Fermi level throughout the structure. Hence excessive charge transfer between the absorber and the second collection layer is prevented, which helps to avoid establishing an electric field in the absorber layer. By "approximately equal" in this context it is meant that the magnitude of the recited energy difference is within +/−50%, more preferably +/−25%, still preferably +/−10% of that of the potential difference, or vice versa. Still preferably, where the first doping type is n-type, the energy difference between the bottom of the conduction band of the radiation-absorbing layer and the top of the valence band of the second collection layer may be substantially equal in magnitude to the potential difference across the barrier layer, or where the first doping type is p-type, the energy difference between the bottom of the conduction band of the second collection layer and the top of the valence band of the radiation-absorbing layer is approximately equal in magnitude to the potential difference across the barrier layer, "substantially equal" energies being as defined above.

Since the second portion of the barrier layer is not adjacent to the absorber layer, its thickness does not significantly affect the level of generation-recombination noise. Nonetheless, it is preferred that the thickness of the second portion of the barrier layer is substantially equal to or greater than the width of the depletion region in the second portion of the barrier layer, such that the thickness of the whole barrier layer is substantially equal to or greater than the width of the depletion region of the heterojunction within the barrier layer. In this way the electric field arising from the depletion region is substantially contained within the barrier layer.

In embodiments where the second portion of the barrier layer acts as a second collection layer (i.e. no additional second collection layer is provided), the thickness of the second portion of the barrier layer is preferably greater than the width of the depletion region in the second portion of the barrier layer. This leaves a "non-depleted" part of the second portion (adjacent the surface of the barrier layer which is furthest from the radiation-absorbing layer) which will be well adapted to collect minority carriers, and hence operates particularly well as a de facto second collection layer.

In other implementations where an additional second collection layer is provided adjacent to the second portion of the barrier layer, the second collection layer having substantially uniform doping of the second doping type, preferably the thickness of the second portion of the barrier layer is substantially equal to the width of the depletion region in the second portion of the barrier layer such that the thickness of the whole barrier layer is substantially equal to the width of the depletion region of the heterojunction within the barrier layer. Thus the electric field extends substantially across the full thickness of the barrier layer but not into the second collection layer which therefore remains non-depleted.

Preferably, the radiation-absorbing layer has a lower doping level than the first collection layer.

Advantageously, the doping level of the first portion of the barrier layer is lower than the doping level of the second portion of the barrier layer.

Preferably, the first collection layer and the radiation-absorbing layer are formed of the same material.

In preferred embodiments, the barrier region has a thickness of at least 20 nm, preferably 50 nm, more preferably 75 nm and most preferably 100 nm. Also preferably, the barrier region may have a maximum thickness of 500 nm, preferably 250 nm, more preferably 150 nm and most preferably 100 nm. Advantageously, the barrier region should have a sufficient thickness to prevent the tunneling of carriers across the barrier region. The band gap of the barrier region should be sufficiently high to present a significant energy barrier to majority carriers and also a high activation energy for the formation of electron-hole pairs, so as to prevent generation of thermalized carriers within the barrier itself. Preferably, the barrier region has a band gap of between 800 meV and 3000 meV.

The "radiation-absorbing region" is where the majority of photons impinging on the photodetector will be absorbed by the device and generate carriers, and hence can be identified based on knowledge of the thickness of each region and the radiation absorption coefficient of the material. Upon generation, the carriers diffuse towards the collection regions (i.e. the first collection region, and the second collection region if provided or the far surface of the second portion of the barrier region if not) thereby generating the photocurrent. Hence the radiation-absorbing region preferably has a thickness approximately equal to or greater than the absorption length of the radiation to be detected. In particularly preferred embodiments, the radiation-absorbing region has a thickness of at least 5% greater than the absorption length of the radiation to be detected, preferably at least 15%, more preferably at least 25% and most preferably at least 30%. Also preferably, the radiation-absorbing region may have a maximum thickness of 150% greater than the absorption length of the radiation being detected, preferably 100%, more preferably 75% and most preferably 50%. The target radiation may be, for example, infrared radiation, e.g. in the waveband 3-5 microns.

Due to the high sensitivity and thermal stability of the disclosed photodetector, as well as its low power usage (due to the reduced need for cooling and no need for an external bias voltage), the device is particularly well suited for applications including gas sensing. Hence, the present invention further provides a gas sensor comprising a photodetector of the sort described above. Examples of gas sensors which comprise photodetectors and in which the presently disclosed device could be utilised are disclosed in U.S. Pat. No. 8,692,997 and U.S. Pat. No. 8,665,424, amongst others.

Examples of photodetectors in accordance with the present invention will now be described and contrasted with conventional photodetectors with reference to the accompanying drawings, in which.

Figure 1:
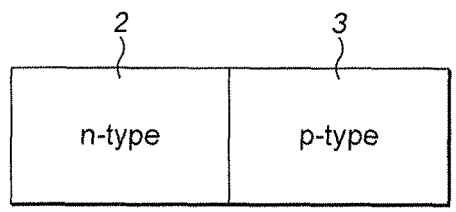
FIG. 1 shows an example of a conventional "n-p" photodetector.
Figure 2:
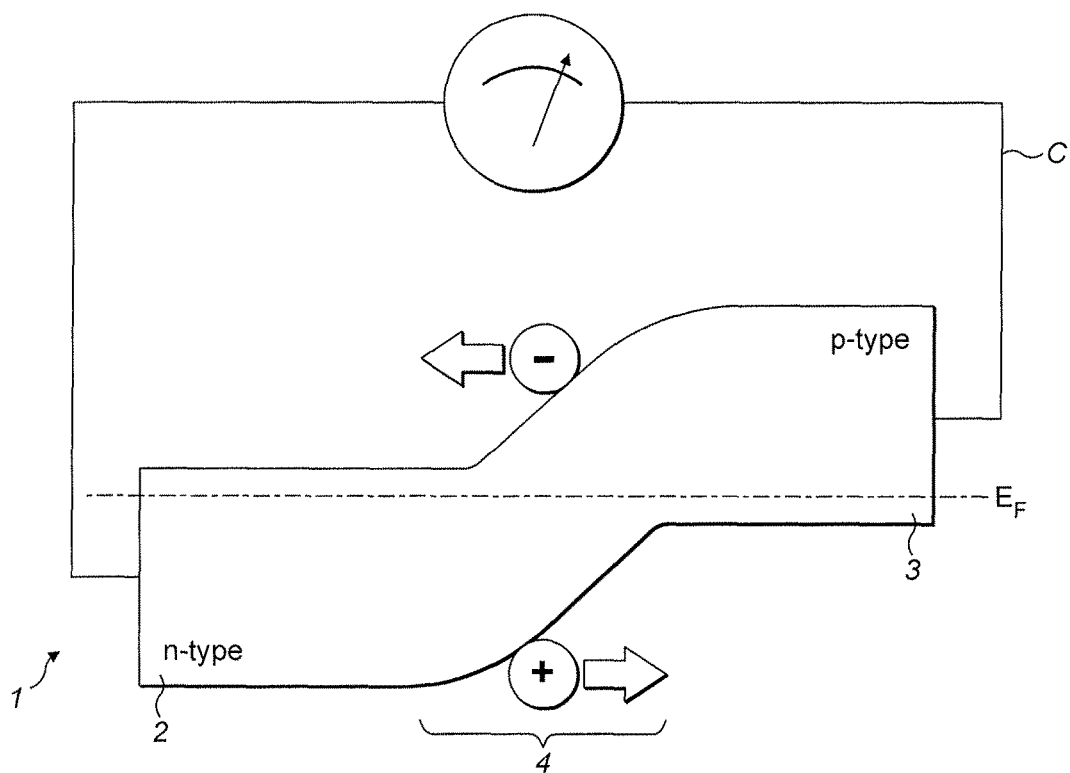
FIG. 2 is an energy level diagram illustrating the operation of the photodetector of FIG. 1.
Figure 3:
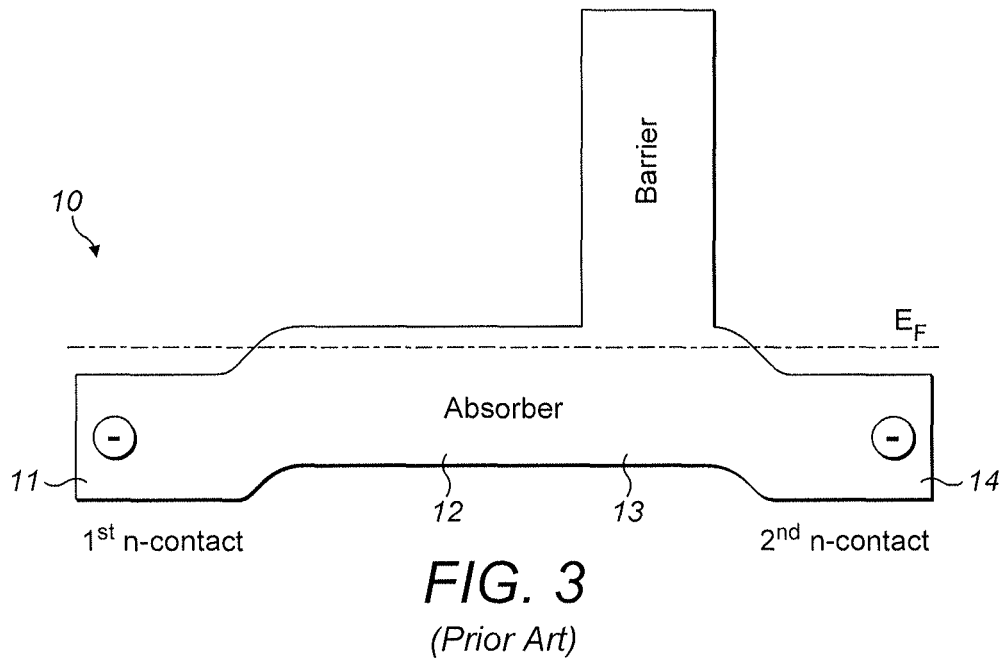
FIG. 3 is an energy level diagram illustrating the operation of an example of a conventional "nBn" photodetector without external bias.
Figure 4:
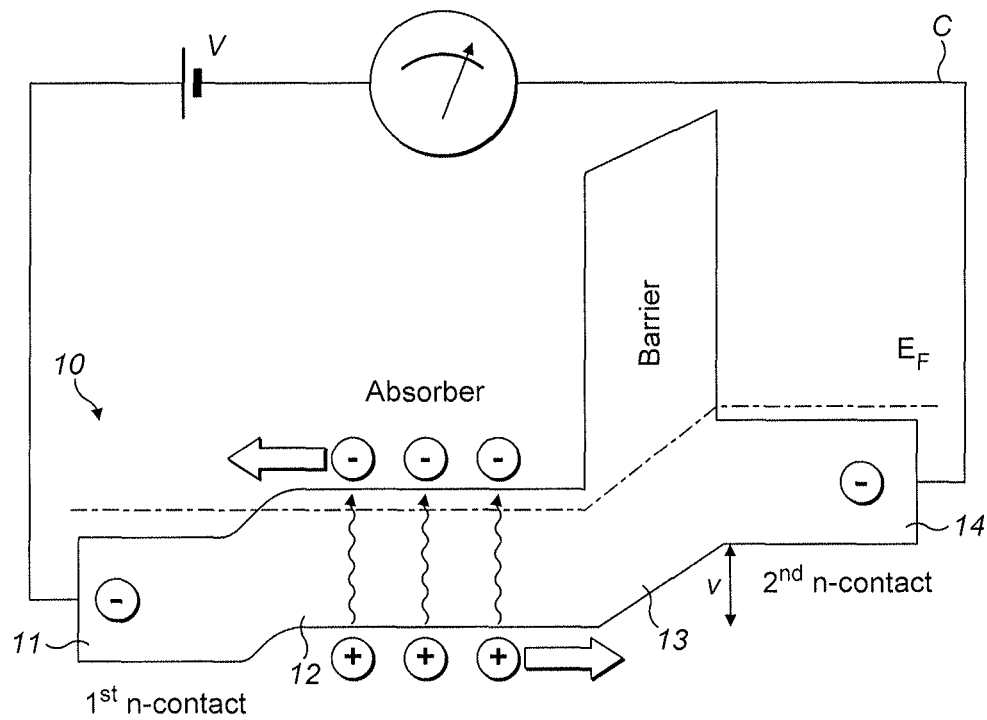
FIG. 4 is an energy level diagram illustrating the operation of the photodetector of FIG. 3 with an applied external bias.
Figure 5:
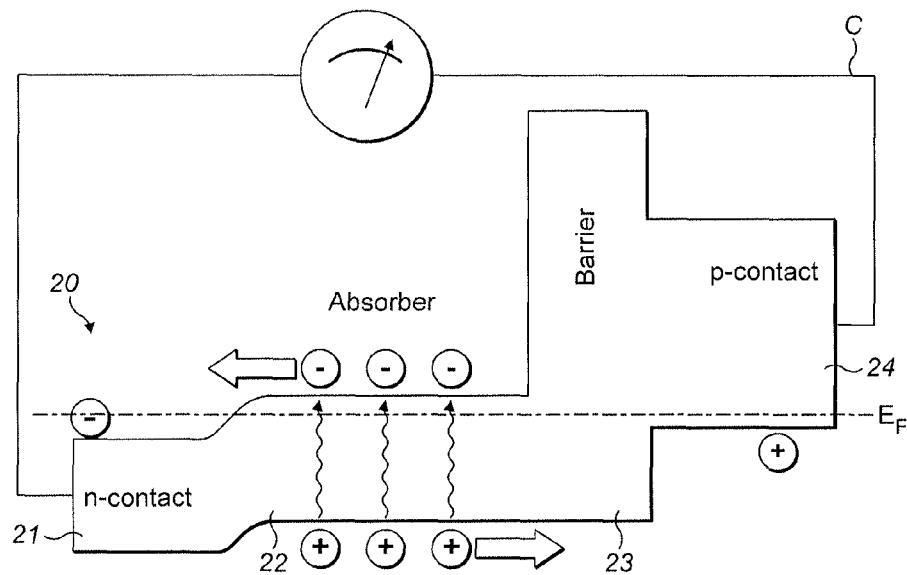
FIG. 5 is an energy level diagram illustrating the operation of an example of a conventional "nBp" photodetector.
Figure 6:
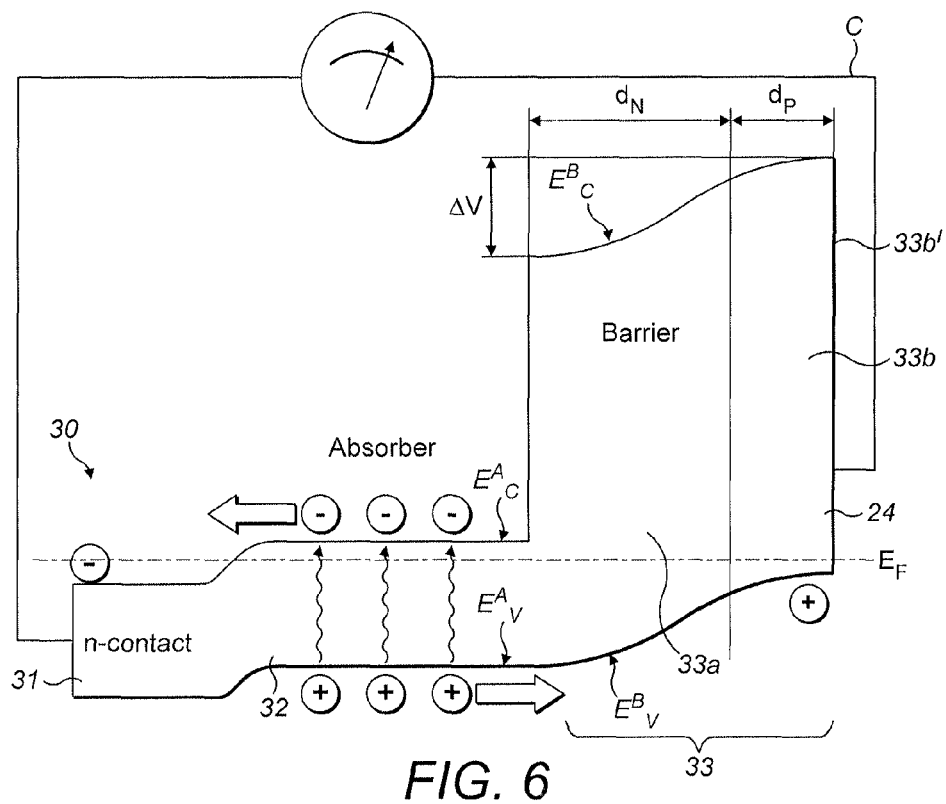
FIG. 6 is an energy level diagram illustrating the operation of a photodetector in accordance with a first embodiment of the present invention.
Figure 7:
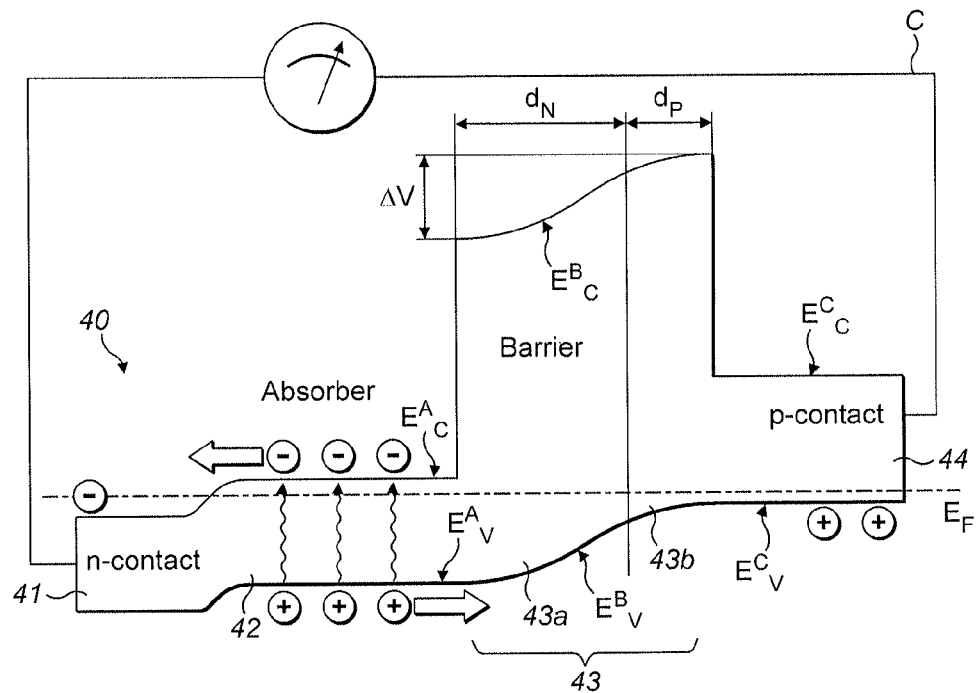
FIG. 7 is an energy level diagram illustrating the operation of a photodetector in accordance with a second embodiment of the present invention.
Figure 8:
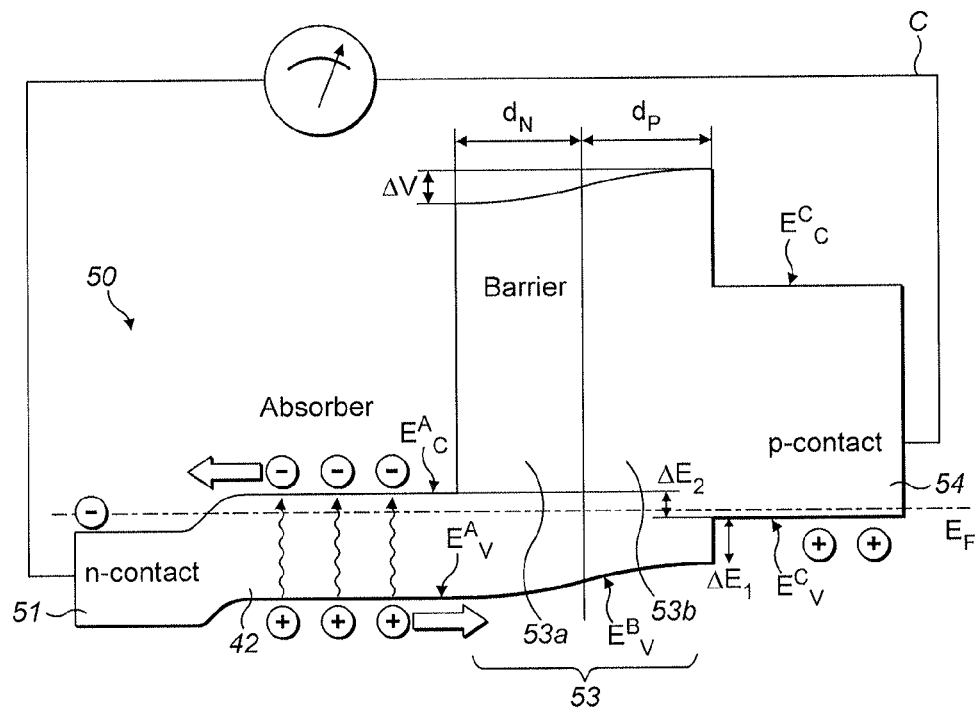
FIG. 8 is an energy level diagram illustrating the operation of a photodetector in accordance with a third embodiment of the present invention.

Preferred embodiments of the present invention are depicted in FIGS. 6, 7 and 8 and will be described below. In all cases the described examples are based on a "nBp" type structure, i.e. where the layer in which the radiation is absorbed is of the negative doping type (n-type), and the minority carriers diffuse across the barrier to a positively-doped region (p-type). However, all the principles can be transposed to structures of the opposite polarity, i.e. "pBn" type devices, in which the radiation-absorbing layer is p-type and the minority carriers diffuse across the barrier to an n-type region. To arrive at such structures, the doping type indicated for each layer in the description below should be inverted, i.e. changed from n-type to p-type and vice versa. It will be appreciated that in each of the embodiments described below, it should be assumed that the Fermi levels are equalised throughout the structure, unless explicitly stated otherwise (for example, if an external bias is applied to the device).

As shown in FIG. 6, in a first embodiment the semiconductor heterostructure forming the photodetector 30 comprises three layers: a first collection layer 31, which here is n-type ("n-contact") and preferably highly doped; a radiation-absorbing layer 32 ("absorber") which is of the same doping type as the first collection layer (here, n-type); and a barrier layer 33. The absorber 32 should have a smaller band gap (i.e. energy difference between the top of its valence band $E^A_V$ and the bottom of its conduction band $E^A_C$) than that of the first collection layer 31, and also preferably has a lower degree of doping than the first collection layer 31. The band gap of the barrier layer 33 (i.e. $E^B_C - E^B_V$) must be larger than that of the absorber 32, preferably much greater. The top of the valence band of the barrier layer 33 ($E^B_V$) is substantially equal to that of the absorber layer 32 ($E^A_V$) and of the first collection layer 31.

The barrier layer 33 comprises a first portion 33a which is of the same doping type as the absorber layer 32 (hence n-type in this example) and is adjacent to the absorber layer 32. A second portion 33b of the barrier layer 33 is of the other doping type (hence p-type in this example). Preferably, the first portion 33a is weakly doped whilst the second portion 33b is highly doped. The oppositely doped portions 33a, 33b give rise to a depletion region existing within the barrier layer 33, resulting in a potential difference ΔV and hence an electric field across the barrier layer 33. This accelerates the minority carriers (here, holes) across the barrier 33 from the absorber 32 such that the photocurrent detected in the external circuit C is more accurately representative of the received radiation. No external bias is required to enable the photocurrent or to establish this electric field. The wide band gap of the barrier layer 33 prevents significant thermal generation of electron-hole pairs in the barrier layer itself due to the large activation energy that would be required for such generation.

The concentration of donors $N_D$ in the first portion 33a of the barrier is related to the thickness $d_N$ of that portion and to the concentration of acceptors $N_A$ in the second barrier portion 33b. In this case, the thickness is chosen so that substantially all the donors in the first portion 33a are ionized and hence the thickness $d_N$ is substantially equal to the depletion region thickness in the first portion 33a of the barrier 33. In other examples, the thickness $d_N$ of this region could be arranged to be greater than (or, less preferably, lesser than) the depletion region thickness. Hence, $N_D$ and $d_N$ are related as follows:

$$d_N \approx \sqrt{\frac{2\varepsilon}{e} \cdot \frac{N_A}{N_D(N_A + N_D)} \cdot \Delta V} \quad (1)$$

Where ∈ is the dielectric constant, e is the electron charge, and ΔV is the contact potential difference of the p-n junction formed in the barrier 33. ΔV can be written as:

$$\Delta V \approx \frac{\Delta E}{e} + \frac{kT}{e} \ln\left(\frac{N_D^a N_A^c}{N_C^a N_V^c}\right), \quad (2)$$

$$N_{C,V}^{a,c} = 2\left(\frac{2\pi m_{c,v} kT}{(2\pi\hbar)^2}\right)^{3/2}$$

Here, $\Delta E = E_C^{absorber} - E_V^{barrier}$ is the difference between the energies of the bottom of the absorber conduction band and top of the barrier valence band, k is the Boltzmann constant, T is the temperature, $m_{c,v}$ are the effective masses of electrons in the absorber and holes in the second collection layer, $N_D^a$ is the concentration of donors in the absorber layer, $N_A^c$ is the concentration of the acceptors in the second collection layers, h is Planck's constant. The expressions (1) and (2) are obtained on the assumption that the charge carriers are non-degenerate.

By arranging the thickness $d_N$ of the first portion 33a to be substantially equal to the depletion region width in the same region, the electric field established by the p-n junction is substantially constrained to the barrier layer and in particular does not extend significantly into the absorption layer 22. This allows the thickness of the absorption layer 22 to be increased without leading to an increase in the degree of generation-recombination noise.

Whilst not essential, it is preferred that the thickness $d_p$ of the second portion 33b region of the barrier should be greater than or substantially equal to the width of the corresponding depletion region in that portion. Hence, preferably:

$$d_P \geq \sqrt{\frac{2\varepsilon}{e} \cdot \frac{N_D}{N_A(N_A + N_D)} \cdot \Delta V} \quad (3)$$

In the present embodiment, the outermost part of the second portion 33b of the barrier layer (represented by reference numeral 33b' in FIG. 6) acts as a second collection layer of the device in the sense that the minority carriers diffuse towards it. In order to improve the effectiveness of this part of the barrier for this purpose, it is preferred that the thickness $d_P$ of the second portion 33b of the barrier is greater than (not equal to) the width of the depletion region in this portion. This results in the outermost part 33b' of the portion 33b being non-depleted and outside of the electric field, optimising this part of the device to function as a collector.

It will be appreciated that a pBn photodetector in line with the above principles can be formed using a p-type first collection layer, a p-type absorber and a barrier region in which the first portion is p-type and the second is n-type. In this case since the minority carriers are now electrons it is the conduction band energies of the barrier and absorber ($E^B_C$ and $E^A_C$) which should substantially match one another, the obstruction presented by the barrier occurring in the valence band so as to prevent the flow of majority carriers (holes).

A second embodiment of the invention is shown in FIG. 7. Here, the detector structure 40 comprises four layers: a first collection layer 41, which here is n-type ("n-contact") and preferably highly doped; a radiation-absorbing layer 42 ("absorber") which is of the same doping type as the first collection layer (here, n-type); a barrier layer 43; and a second collection layer 44 which is of the opposite doping type as that of the first collection layer 41. The first collection layer 41, radiation-absorbing layer 42 and barrier layer 43 each have substantially the same properties in terms of their doping levels and band gaps as the corresponding layers in the FIG. 6 embodiment, although different considerations apply to the thickness of the barrier 43 as described further below. In particular, the barrier 43 comprises a first n-type portion 43a and a second p-type portion 43b. The second collection layer 44 has a smaller band gap than that of the barrier layer 43 and is preferably of a high doping level (e.g. equal to that of the second portion 44b of the barrier). Preferably, the top of the valence band of the second collection layer 44 ($E^C_V$) is substantially equal to that of the barrier 43, the absorber 42 and the n-contact 41. The purpose of the additional collection layer 44 is to protect the device surface from oxidation as may especially occur where an aluminium alloy is used to form the barrier layer 43. In a particular embodiment the first collection layer is made of the same material as absorber.

The same considerations as regards the thickness $d_N$ of the first portion 43a of the barrier as described in the first embodiment apply equally here. However, in the present embodiment, since an additional second collection layer 44 is provided, the barrier layer 43 no longer needs to act as a collector. As such it is preferred that the thickness $d_P$ of the second portion 43b of the barrier layer be substantially equal to (not greater than or lesser than) the width of the depletion region in the same portion 43b. This again can be determined in accordance with equation (3) given above. As such, the electric field established by the p-n junction in the barrier layer does not extend substantially into the second collection layer 44, which remains non-depleted.

Again, a pBn-type photodetector in line with the above principles can be formed using a p-type first collection layer, a p-type absorber, a barrier region in which the first portion is p-type and the second is n-type, and an n-type second collection layer. In this case since the minority carriers are now electrons it is the conduction band energies of the second collection layer, barrier and absorber ($E^C_C$, $E^B_C$ and $E^A_C$) which should substantially match one another, the obstruction presented by the barrier occurring in the valence band so as to prevent the flow of majority carriers (holes).

A third embodiment of the invention is shown in FIG. 8. Again, the photodetector 50 comprises four layers, namely: a first collection layer 51, which here is n-type ("n-contact") and preferably highly doped; a radiation-absorbing layer 52 ("absorber") which is of the same doping type as the first collection layer (here, n-type); a barrier layer 53; and a second collection layer 54 which is of the opposite doping type as that of the first collection layer 51. The first collection layer 51 and radiation-absorbing layer 52 each have substantially the same properties in terms of their doping levels and band gaps as the corresponding layers in the embodiments of FIGS. 6 and 7, although different considerations apply to the barrier 53 and second collection layer 54 as described further below.

There are two main differences between the photoconductor of the present embodiment and that of FIG. 7. First is the material used for the second collection layer 54 ("p-contact"). The top of the valence band of this material ($E^C V$) is higher than the top of the valence bands of the absorber 52 ($E^A_V$) and the barrier 53 ($E^B_V$). Hence there is an energy difference $\Delta E_1$ existing in the valence band between the barrier layer 53 and the collection layer 54. Secondly, the barrier doping is implemented differently.

Again, in this embodiment the barrier comprises a first portion 53a which is n-type and a second portion 53b which is p-type. However in this case both of the portions 53a, 53b have a low doping level so a substantially symmetrical p-n junction is formed (although this is not essential). The barrier width d ($=d_N+d_P$) and the dopant concentrations $N_A$ (acceptors in the p-region) and $N_D$ (donors in the n-region) are chosen so that the width of the barrier d is substantially equal to the width of the depletion region formed by the p-n junction:

Hence, $$d \approx \sqrt{\frac{2\varepsilon}{e} \cdot \frac{N_D + N_A}{N_D N_A} \cdot \Delta V} \quad (4)$$

where $\Delta V$ is defined by expression (2). This requirement means that all the donors and acceptors in the barrier are ionized.

Further, it is preferable that the material of the second contact layer (p-contact) 54 is chosen so that the bottom of the absorber's conduction band ($E^A_C$) and the top of the p-contact's valence band ($E^C_V$) are related as follows:

$$E_v^C \approx E_c^A - \Delta V \quad (5)$$

In other words, the energy difference $\Delta E_2$ between the bottom of the absorber's conduction band ($E^A_C$) and the top of the p-contact's valence band ($E^C_V$) is approximately equal to $\Delta V$, e.g. to within +/−50%, more preferably +/−25%, still preferably +/−10%. This has the result that only a small amount of charge transfer is required for the Fermi levels to equalise across the device and hence excessive charge transfer between the absorber 52 and the contact 54 is suppressed. This prevents the onset of a built-in electric field in the absorber 52 which could otherwise promote generation-recombination noise.

Again, a pBn-type photodetector in line with the above principles can be formed using a p-type first collection layer, a p-type absorber, a barrier region in which the first portion is p-type and the second is n-type, and an n-type second collection layer. In this case since the minority carriers are now electrons it is the conduction band energies of the barrier and absorber ($E^B_C$ and $E^A_C$) which should substantially match one another, the obstruction presented by the barrier occurring in the valence band so as to prevent the flow of majority carriers (holes). The energy difference $\Delta E_1$ will now exist in the conduction band between the barrier layer 53 and the collection layer 54, and the energy difference $\Delta E_2$ will be between the top of the absorber's valence band ($E^A_V$) and the bottom of the p-contact's conduction band ($E^C_C$).

In all embodiments, it is preferred that the barrier region has a thickness of at least 20 nm, preferably 50 nm, more preferably 75 nm and most preferably 100 nm. Also preferably, the barrier region may have a maximum thickness of 500 nm, preferably 250 nm, more preferably 150 nm and most preferably 100 nm. Advantageously, the barrier region should have a sufficient thickness to prevent the tunneling of carriers across the barrier region. The band gap of the barrier region should be sufficiently high to present a significant energy barrier to majority carriers and also a high activation energy for the formation of electron-hole pairs, so as to prevent generation of thermalized carriers within the barrier itself. Preferably, the barrier region has a band gap of between 800 meV and 3000 meV.

The radiation-absorbing region preferably has a thickness approximately equal to or greater than the absorption length of the radiation to be detected. In particularly preferred embodiments, the radiation-absorbing region has a thickness of at least 5% greater than the absorption length of the radiation to be detected, preferably at least 15%, more preferably at least 25% and most preferably at least 30%. Also preferably, the radiation-absorbing region may have a maximum thickness of 150% greater than the absorption length of the radiation being detected, preferably 100%, more preferably 75% and most preferably 50%. The target radiation may be, for example, infrared radiation, e.g. in the waveband 3-5 microns.

In accordance with third embodiment, exemplary materials, dopant concentrations and thicknesses of the first collection layer, the radiation-absorbing layer, and the first and second portions of the barrier layer and the second collection layer are given in the table below. This specific configuration of photodetector may have a peak responsivity to light of wavelength around 3.3 μm. It will be appreciated however that the exemplary materials, dopant concentrations and thicknesses of the first collection layer, the radiation-absorbing layer, and the first and second portions of the barrier layer and the second collection layer (if applicable) may also be used with the first and second embodiments of the present invention.

| Layer | Material | Doping, $cm^{-3}$ | Thickness, μm |
|---|---|---|---|
| First collection layer | InAs | n-type, $5 \times 10^{17}$ | 200 |
| Radiation-absorbing layer | InAs | n-type, $1\text{-}2 \times 10^{16}$ | 5 |
| First portion of barrier layer | $AlAs_{0.16}Sb_{0.84}$ | n-type, $4 \times 10^{16}$ | 0.15 |
| Second portion of barrier layer | $AlAs_{0.16}Sb_{0.84}$ | p-type, $4 \times 10^{16}$ | 0.15 |
| Second collection layer | $In_{0.2}Ga_{0.8}As_{0.26}Sb_{0.74}$ | p-type, $1 \times 10^{19}$ | 0.4 |

The invention claimed is:

1. A photodetector, comprising a semiconductor heterostructure having in sequence:
   a first collection layer having substantially uniform doping of a first doping type;
   a radiation-absorbing layer having substantially uniform doping of the first doping type and having a band gap less than or equal to that of the first collection layer; and
   a barrier layer having a band gap greater than that of the radiation-absorbing layer, the top of the valence band of the barrier layer being substantially equal in energy to that of the radiation-absorbing layer where the first doping type is n-type or the bottom of the conduction band of the barrier layer being substantially equal in energy to that of the radiation-absorbing layer where the first doping type is p-type;
   wherein a first portion of the barrier layer is of the first doping type and a second portion of the barrier layer is of a second doping type, the first portion of the barrier layer being adjacent to the radiation-absorbing layer, forming a heterojunction within the barrier layer which gives rise to a depletion region within each portion of the barrier layer, wherein the band gap of the barrier layer is the same in the first and second portions of the barrier layer.

2. A photodetector according to claim 1, wherein the thickness of the first portion of the barrier layer is substantially equal to the width of the depletion region in the first portion of the barrier layer.

3. A photodetector according to claim 1, further comprising:
   a second collection layer adjacent to the second portion of the barrier layer, the second collection layer having substantially uniform doping of the second doping type.

4. A photodetector according to claim 3, wherein the band gap of the second collection layer is less than that of the barrier layer.

5. A photodetector according to claim 3, wherein either:
   where the first doping type is n-type, the top of the valence band of the second collection layer is substantially equal in energy to that of the barrier layer and the radiation-absorbing layer; or
   where the first doping type is p-type, the bottom of the conduction band of the second collection layer is substantially equal in energy to that of the barrier layer and the radiation-absorbing layer.

6. A photodetector according to claim 3, wherein either:
   where the first doping type is n-type, the top of the valence band of the second collection layer is higher in energy than that of the barrier layer and the radiation-absorbing layer; or
   where the first doping type is p-type, the bottom of the conduction band of the second collection layer is lower in energy than that of the barrier layer and the radiation-absorbing layer.

7. A photodetector according to claim 6, wherein either:
   where the first doping type is n-type, the energy difference between the top of the valence band of the second collection layer and the bottom of the conduction band of the radiation-absorbing layer is approximately equal in magnitude to the potential difference across the barrier layer; or
   where the first doping type is p-type, the energy difference between the bottom of the conduction band of the second collection layer and the top of the valence band of the radiation-absorbing layer is approximately equal in magnitude to the potential difference across the barrier layer.

8. A photodetector according to claim 1, wherein the thickness of the second portion of the barrier layer is substantially equal to or greater than the width of the depletion region in the second portion of the barrier layer, such that the thickness of the whole barrier layer is substantially equal to or greater than the width of the depletion region of the heterojunction within the barrier layer.

9. A photodetector according to claim 8, wherein the second portion of the barrier layer acts as a second collection layer, the thickness of the second portion of the barrier layer being greater than the width of the depletion region in the second portion of the barrier layer.

10. A photodetector according to claim 8, further comprising a second collection layer adjacent to the second portion of the barrier layer, the second collection layer having substantially uniform doping of the second doping type, and wherein the thickness of the second portion of the barrier layer is substantially equal to the width of the depletion region in the second portion of the barrier layer such that the thickness of the whole barrier layer is substantially equal to the width of the depletion region of the heterojunction within the barrier layer.

11. A photodetector according to claim 1, wherein the radiation-absorbing layer has a lower doping level than the first collection layer.

12. A photodetector according to claim 1, wherein the doping level of the first portion of the barrier layer is lower than the doping level of the second portion of the barrier layer.

13. A photodetector according to claim 1, wherein the first collection layer and the radiation-absorbing layer are formed of the same material.

14. A photodetector according to claim 1 wherein the first doping type is n-type doping and the second doping type is p-type doping.

15. A photodetector according to claim 1 wherein the first doping type is p-type doping and the second doping type is n-type doping.

16. A photodetector according to claim 1, wherein the barrier region has a thickness of at least 20 nm, preferably 50 nm, more preferably 75 nm and most preferably 100 nm.

17. A photodetector according to claim 1, wherein the barrier region has a maximum thickness of 500 nm, preferably 250 nm, more preferably 150 nm and most preferably 100 nm.

18. The photodetector of claim 1, wherein the barrier region has a sufficient thickness to prevent the tunnelling of carriers across the barrier region.

19. A photodetector according to claim 1, wherein the radiation-absorbing region has a thickness approximately equal to or greater than the absorption length of the radiation to be detected.

20. A photodetector according to claim 1, wherein the radiation-absorbing region has a thickness of at least 5% greater than the absorption length of the radiation to be detected, preferably at least 15%, more preferably at least 25% and most preferably at least 30%.

21. A photodetector according to claim 1, wherein the radiation-absorbing region has a maximum thickness of 150% greater than the absorption length of the radiation being detected, preferably 100%, more preferably 75% and most preferably 50%.

22. A photodetector according to claim 1, wherein the barrier region has a band gap of between 800 meV and 3000 meV.

23. A gas sensor comprising a photodetector according to claim 1.

* * * * *